United States Patent
Duerr et al.

(10) Patent No.: US 12,195,328 B2
(45) Date of Patent: Jan. 14, 2025

(54) SPATIAL LIGHT MODULATOR (SLM) COMPRISING INTEGRATED DIGITAL-TO-ANALOG CONVERTERS

(71) Applicant: Fraunhofer-Gesellschaft zur Foerderung der angewandten Forschung e.V., Munich (DE)

(72) Inventors: Peter Duerr, Dresden (DE); Thomas Presberger, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 980 days.

(21) Appl. No.: 17/199,040

(22) Filed: Mar. 11, 2021

(65) Prior Publication Data

US 2021/0198098 A1    Jul. 1, 2021

Related U.S. Application Data

(63) Continuation of application No. PCT/EP2019/074010, filed on Sep. 9, 2019.

(30) Foreign Application Priority Data

Sep. 11, 2018  (DE) .......................... 102018215428.7

(51) Int. Cl.
*G09G 3/30* (2006.01)
*B81B 7/00* (2006.01)
(Continued)

(52) U.S. Cl.
CPC .......... *B81B 7/008* (2013.01); *G02B 26/0833* (2013.01); *H03M 1/802* (2013.01);
(Continued)

(58) Field of Classification Search
None
See application file for complete search history.

(56) References Cited

U.S. PATENT DOCUMENTS 6,498,438 B1 * 12/2002 Edwards ............... H03M 1/804
                                                              313/506
6,611,261 B1    8/2003 Zhang et al.
(Continued)

OTHER PUBLICATIONS

Fang, David, et al., "A 6-b DAC and Analog DRAM for a Maskless Lithography Interface in 90 nm CMOS", IEEE.
(Continued)

*Primary Examiner* — Joseph R Haley
(74) *Attorney, Agent, or Firm* — Perkins Coie LLP; Michael A. Glenn

(57) ABSTRACT

Arrangement for controlling micromechanical actuators, including a digital-to-analog converter and a plurality of micromechanical actuators; wherein the micromechanical actuators are coupled to a connecting structure; wherein the digital-to-analog converter is configured to provide a voltage to be applied to the connecting structure by an adjustable capacitive voltage division that is dependent on a digital input value of the digital-to-analog converter, wherein the digital-to-analog converter is configured to directly include a capacitance of the connecting structure in the capacitive voltage division.

20 Claims, 11 Drawing Sheets

(51) Int. Cl.
*G02B 26/08* (2006.01)
*H03M 1/80* (2006.01)
*H04N 9/31* (2006.01)

(52) U.S. Cl.
CPC ...... *H04N 9/3152* (2013.01); *B81B 2201/042* (2013.01); *G09G 2300/08* (2013.01)

(56) References Cited

U.S. PATENT DOCUMENTS

| | | | |
|---|---|---|---|
| 7,321,416 B2 | 1/2008 | Reijnen et al. | |
| 9,395,531 B2 | 7/2016 | Yeung | |
| 2010/0238146 A1* | 9/2010 | Zebedee | H03M 1/687 345/98 |
| 2012/0274611 A1* | 11/2012 | Seo | H01L 29/78696 257/E33.071 |
| 2014/0002887 A1* | 1/2014 | Yeung | G09G 3/3473 359/291 |
| 2015/0348492 A1 | 12/2015 | Park et al. | |
| 2016/0078842 A1 | 3/2016 | Farenc et al. | |
| 2016/0111058 A1 | 4/2016 | Morita | |
| 2019/0197945 A1* | 6/2019 | Kim | G09G 3/32 |

OTHER PUBLICATIONS

Gehner, Andreas, et al., "MEMS analog light processing: an enabling technology for adaptive optical phase control", Biomedical photonics and optoelectronic imaging Nov. 8-10, 2000, Beijing, China, vol. 6113, pp. 61130K-61130K-15, XP055257131, Bellingham, Wash., US DOI: 10.1117/12.651731,, pp. 1-4.

Kulkarni, Meghana, et al., "6-Bit Charge Scaling DAC and SAR ADC", International Journal of Advanced Research in Electrical, Electronics and Instrumentation Engineering, vol. 3, issue 12.

Lakner, Hubert, et al., "Design and Fabrication of Micromirror Arrays for UV-Lithography", Proceedings of SPIE, vol. 4561.

Saponara, Sergio, et al., "A Cost-Effective 10-Bit D/A Converter for Digital-Input MOEMS Micromirror Actuation", Hindawi Publishing Corporation, VLSI Design, 2010, Article ID 169079.

* cited by examiner

SPATIAL LIGHT MODULATOR (SLM) COMPRISING INTEGRATED DIGITAL-TO-ANALOG CONVERTERS

CROSS-REFERENCES TO RELATED APPLICATIONS

This application is a continuation of copending International Application No. PCT/EP2019/074010, filed Sep. 9, 2019, which is incorporated herein by reference in its entirety, and additionally claims priority from German Application No. DE 102018215428.7, filed Sep. 11, 2018, which is incorporated herein by reference in its entirety.

The present invention relates to a device comprising micromechanical actuators and to a method of controlling said actuators.

BACKGROUND OF THE INVENTION

Micromechanical actuators are used, for example, in spatial light modulators, or SLM. The micromechanical actuators used for this purpose are not only switched back and forth between two extreme positions, but they can assume any deflection values within a defined working range. This is achieved, for example, by a balance between electrostatic or electromagnetic forces, on the one hand, and restoring spring forces, on the other hand. Such electrically operated actuators may be used to mechanically move micromechanical elements and to bring them into desired positions. A specific value for an analog electrical voltage that has been applied determines a position of the micromechanical actuator that to be achieved.

A multitude of such micromechanical actuators may be arranged, for example, on a substrate of an electronic component, e.g. an SLM chip, as a one-dimensional series or a two-dimensional matrix. In one embodiment of such devices, a multitude of micromirrors are connected to the micromechanical actuators so that these micromirrors are adjustable in terms of elevation and/or tilt, which is referred to as a spatial light modulator. In this context, such a micromirror is also referred to as a pixel.

In known embodiments, a specific address voltage is switched through to a corresponding micromechanical actuator via an analog interface through analog switches on the SLM chip. Disadvantages of such an analog interface include, for example: an increased susceptibility to interference, a limited bandwidth of the analog lines, and a relatively large amount of power dissipation of the overall system.

The relatively large amount of power dissipation is due to the fact that, in addition to the actual desired load—the micromechanical actuator—the control circuit may apply the full address voltage to many other, usually much larger, parasitic loads. Parasitic loads include, for example, supply lines, bond pads (areas of a semiconductor element that are to be contacted), ESD (electrostatic discharge) protection circuits, etc., and these components may prevent a compact overall design of the SLM chip due to their mere size (FIG. 1).

In one known embodiment, under each micromechanical actuator there is an electronic random access memory device, e.g., an analog DRAM (dynamic random access memory) cell comprising only one transistor (e.g., a pixel transistor) and a memory capacity that stores an address voltage value until a next refresh. The analog voltage is written into the matrix line by line. To this end, all gates of the pixel transistors of a row are opened, while at the same time, the column lines and, thus, the sources of the pixel transistors each have the desired voltages. Upon closing of the gates, the voltages applied are stored in the capacities of the pixel cells of this row. All pixel transistor sources of a column are connected to the column line. The total capacitance of such a column line is mainly determined by the pn capacitance of a so-called source region of the pixel transistors and therefore increases as the size of the array increases. FIG. 3 shows a region of a DRAM structure of a spatial light modulator with three memory cells on a column line.

SUMMARY

According to an embodiment, an arrangement for controlling micromechanical actuators may have: a digital-to-analog converter; and a plurality of micromechanical actuators; wherein the micromechanical actuators are coupled to a connecting structure; wherein the digital-to-analog converter is configured to provide a voltage to be applied to the connecting structure by an adjustable capacitive voltage division that is dependent on a digital input value of the digital-to-analog converter, wherein the digital-to-analog converter is configured to directly incorporate a capacitance of the connecting structure into the capacitive voltage division.

According to another embodiment, a method of controlling micromechanical actuators in an arrangement comprising a plurality of micromechanical actuators coupled to a connecting structure may have the steps of: determining a voltage present at the connecting structure by an adjustable capacitive voltage division that is dependent on a digital input value, and directly incorporating a capacitance of the connecting structure into the capacitive voltage division.

According to yet another embodiment, a non-transitory digital storage medium may have a computer program stored thereon to perform the method of controlling micromechanical actuators in an arrangement comprising a plurality of micromechanical actuators coupled to a connecting structure, which method may have the steps of: determining a voltage present at the connecting structure by an adjustable capacitive voltage division that is dependent on a digital input value, and directly incorporating a capacitance of the connecting structure into the capacitive voltage division, when said computer program is run by a computer.

In the context of the invention, a multitude of analog address voltage values for the micromechanical actuators are to be transmitted from a control circuit to the SLM component.

Also, in the context of the invention, the interface of the SLM component with its control circuit is configured in a digital manner, which enables interference-resistant signals at a low voltage level and, thus, low power dissipation. Accordingly, conversion of the digital signals into analog address voltages is performed on the SLM chip itself.

According to a first embodiment, an arrangement for controlling micromechanical actuators comprises the following features: a digital-to-analog converter and a plurality of micromechanical actuators; wherein the micromechanical actuators are coupled to a connecting structure; wherein the digital-to-analog converter is configured to provide a voltage to be applied to the connecting structure by an adjustable capacitive voltage division that is dependent on a digital input value of the digital-to-analog converter, wherein the digital-to-analog converter is configured to directly incorporate a capacitance of the connecting structure into the capacitive voltage division.

This embodiment is based on the finding that it is advantageous to integrate a chip comprising micromechanical actuators, such as a spatial light modulator (SLM) chip, with a digital data interface and charge scaling digital-to-analog converters (DACs), wherein the capacitance of the column line is directly incorporated into the capacitive voltage dividers, and no operational amplifiers (OPVs) are used. This makes it possible to save power dissipation of the OPV and to use interference-resistant signals at low voltage levels and, thus, low power dissipation.

In another embodiment, the connecting structure comprises a connecting line and a plurality of switching transistors connected between the column line and storage capacitors associated with respective micromechanical actuators. This embodiment is based on the finding that it is advantageous to serially write, in terms of time, new voltage values to the actuators connected to the connecting structure.

In another embodiment, the connecting structure is configured to be passive. This embodiment is based on the finding that it is advantageous to passively couple the connecting line to a plurality of capacitors so as to thereby provide a further adjustable voltage division. Such an embodiment does not require an operational amplifier as an impedance converter at the output so as to provide a voltage independent of load. An operational amplifier would involve additional power, and additional attention would have to be paid to linearity and transient response.

In another embodiment, the connecting line is DC-coupled or directly coupled to a plurality of switched capacitors of the digital-to-analog converter. This embodiment is based on the finding that it is advantageous to incorporate the capacitance of the connecting line of the spatial light modulator directly into the capacitive voltage dividers. Omitting an operational amplifier in this way is possible without sacrificing accuracy, since the loads to be served are small.

In another embodiment, the digital-to-analog converter is configured to incorporate the capacitance of the connecting line and of semiconductor regions coupled thereto into the capacitive voltage division toward a reference potential. This embodiment is based on the finding that it is advantageous if less power is converted with suitably dimensioned capacitances than would have been possible in a circuit comprising an additional operational amplifier.

In another embodiment, the digital-to-analog converters and the micromechanical actuators, which are advantageously arranged in a spatial light modulator (SLM chip), are arranged on a semiconductor chip. This embodiment is based on the finding that it is advantageous to integrate the digital-to-analog converters directly on the SLM chip to enable a compact design of the overall system with a digital interface. In this context, the power consumption should be kept as low as possible so that the voltages that may be used for the micromirrors can be generated at the highest possible frame rates and so that the heat generation of the overall system remains within acceptable limits. In another embodiment, the micromechanical actuators are arranged in columns, with a plurality of actuators in a column being coupled to a common connecting structure.

In yet another embodiment, a first portion of the actuators in an actuator column is coupled to a first column line, and a second portion of the actuators in the actuator column is coupled to a second column line, and the arrangement is configured to alternately couple the first column line and the second column line to switched capacitors of the digital-to-analog converter or to two different digital-to-analog converters simultaneously.

This embodiment is based on the finding that it is advantageous to halve the capacitance of the column line while maintaining the speed of the digital-to-analog converter, and that the capacitors of the DAC may also be halved accordingly, which results in a corresponding reduction in converted power.

In another embodiment, the digital-to-analog converter has a first group of capacitors whose first terminals are DC-coupled and whose second terminals may be connected to at least two different reference potentials, as a function of a digital value. One of these two reference potentials, usually the lower one, may be the circuit ground/GND. In this context, the digital-to-analog converter has a second group of capacitors whose first terminals are DC-coupled, and whose second terminals can be connected to at least two different reference potentials, as a function of a digital value. Here, the first terminals of the first group of capacitors are DC-coupled to the connecting structure, and the first terminals of the second group of capacitors are coupled to the first terminals of the first group of capacitors via a first coupling capacitor. In this regard, the digital-to-analog converter comprises a first reset switch configured to couple the first terminals of the capacitors of the first group of capacitors to an associated reference potential; wherein the digital-to-analog converter comprises a second reset switch configured to couple the first terminals of the capacitors of the second group of capacitors to an associated reference potential.

This embodiment is based on the finding that it is advantageous if the differences in the capacitances of the capacitors used do not become too large.

In a further embodiment, the digital-to-analog converter has a first group of capacitors whose first terminals are DC-coupled and whose second terminals may be connected to at least three different reference potentials, possibly including the circuit ground/GND, as a function of a digital value, the selection of the reference potentials depending on at least two bits of a digital value. In this context, the digital-to-analog converter has a second group of capacitors whose first terminals are DC-coupled, and whose second terminals may be connected to at least three different reference potentials, possibly including circuit ground, as a function of a digital value. In this context, the first terminals of the first group of capacitors are DC-coupled to the connecting structure, and the first terminals of the second group of capacitors are coupled to the first terminals of the first group of capacitors via a first coupling capacitor. In this regard, the digital-to-analog converter includes a first reset switch configured to couple the first terminals of the capacitors of the first group of capacitors to an associated reference potential. In addition, the digital-to-analog converter comprises a second reset switch configured to couple the first terminals of the capacitors of the second group of capacitors to an associated reference potential.

This embodiment is based on the finding that it is advantageous to initially apply, in the initialization phase, a fraction of the output voltage range to a load capacitance, which allows the highest of the reference voltages that may be used or the capacitances of the capacitors used to be designed to be much smaller. In such an embodiment, the second group of capacitors may have, for example, fewer different capacitances than the first group of capacitors.

In another embodiment, for example, the second group of capacitors may have fewer different capacitances than the first group of capacitors.

In a further embodiment, the digital-to-analog converter comprises a third group of capacitors whose first terminals are DC-coupled, and whose second terminals may be connected to at least two different reference potentials, as a function of a digital value. In this context, the first terminals of the third group of capacitors are coupled to the first terminals of the second group of capacitors via a second coupling capacitor. In this regard, the digital-to-analog converter comprises a third reset switch configured to couple the first terminals of the capacitors of the third group of capacitors to an associated reference potential. This embodiment is based on the finding that it is advantageous to couple the third group of capacitors to the first terminals of the second group of capacitors via a second coupling capacitor, while allowing further improvement of the circuit.

In another embodiment, the capacitance values of the first group of capacitors are stepped in a binary manner, with the capacitance values being multiples of a basic capacitance. In this regard, the capacitance values of the second group of capacitors are also stepped in a binary manner and are multiples of the basic capacitance, a maximum capacitance value in the second group of capacitors being at most half the maximum capacitance value in the first group of capacitors. This embodiment is based on the finding that it is advantageous to reduce at least the capacitance value of the capacitors from the second group of capacitors by this measure.

In a further embodiment, the capacitance values of the first group of capacitors are stepped in a binary manner, with the capacitance values being multiples of a basic capacitance. Here, the capacitance values of the second group of capacitors are also stepped in a binary manner and are multiples of the basic capacitance, a maximum capacitance value in the second group of capacitors being at most a quarter of the maximum capacitance value in the first group of capacitors. This embodiment is based on the finding that it is advantageous to further reduce at least the capacitance value of the capacitors from the second group of capacitors by this measure.

In another embodiment, the digital-to-analog converter comprises a first reset switch that may couple the connecting structure to a reference potential. This embodiment is based on the finding that it is advantageous to use the first reset switch to, for example, discharge the capacitance of the connecting structure or to precharge it to a desired potential.

In a further embodiment, precharging of the capacitance of the connecting structure and/or of the capacitors of the first group of capacitors associated with the most significant bits occurs during an initialization phase as a function of a digital value, or as a function of one or more most significant bits of the digital value. While this occurs, other switched capacitors associated with less significant bits are precharged to data-independent voltages. In this context, data-dependent connecting of the second terminals of the capacitors of the first group of capacitors and of the second group of capacitors to one of two or more different reference voltages is subsequently performed after the reset switch/preset switch(es) has been opened.

In another embodiment, in an initialization phase associated with providing an analog value on the first connecting structure, at least a first one of the connecting structures is precharged to a potential that is below a target potential for the first connecting structure. Furthermore, in an initialization phase associated with providing an analog value on the second connecting structure, at least a second one of the connecting structures is precharged to a potential that is above a target potential for the second connecting structure. In this process, after completion of the initialization phase associated with providing an analog value on the first connecting structure, the second terminals of the capacitors are connected to corresponding reference potential lines in a data-dependent manner in order to raise the potential of the first connecting structure to a target potential for the first connecting structure. Further, after completion of the initialization phase associated with providing an analog value on the second connecting structure, the second terminals of the capacitors are connected to corresponding reference potential lines in a data-dependent manner in order to decrease the potential of the first connecting structure to a target potential for the second connecting structure.

In another embodiment, a multiplexer is provided in the arrangement, said multiplexer selectively coupling the switched capacitances of the digital-to-analog converter to different connecting structures and/or column lines. This embodiment is based on the finding that it is advantageous to use a multiplexer in order to achieve, for example, a reduction in the layout area of such a circuit while maintaining the speed of the digital-to-analog converter.

In a further embodiment, the arrangement is configured to use the connecting structure as a latch for a charge, and to at least partially transfer the charge stored on the connecting structure to an actuator or to a storage capacitance advantageously individually associated with the actuator following disconnection of the switched capacitances of the digital-to-analog converter from the connecting structure.

According to a further embodiment, a method of controlling micromechanical actuators in an arrangement comprising a plurality of micromechanical actuators coupled to a connecting structure is configured such that a voltage present at the connecting structure is determined by an adjustable capacitive voltage division that is dependent on a digital input value, and wherein a capacitance of the connecting structure is directly incorporated into the capacitive voltage division.

According to another embodiment, a computer program for calculating the data to be transmitted to the SLM is provided, said computer program being executed on a computer.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described in connection with or as a method step also represent a description of a corresponding block or detail or feature of a corresponding device. Some or all of the method steps may be performed by a hardware device (or while using a hardware device) such as a microprocessor, a programmable computer or an electronic circuit, for example. In some embodiments, some or several of the most important method steps may be performed by such a device.

A signal encoded in accordance with the invention may be stored on a digital storage medium or may be transmitted on a transmission medium such as a wireless transmission medium or a wired transmission medium, for example, the internet.

The methods described herein, or any components of the methods described herein, may be implemented at least in part by hardware and/or by software.

The embodiments described above are merely illustrative of the principles of the present invention. It is understood that modifications and variations of the arrangements and details described herein will be apparent to other persons skilled in the art. Therefore, it is intended that the invention be limited only by the scope of protection of the claims below rather than by the specific details presented herein by reference to the description and explanation of the embodiments.

The invention will be explained below with reference to the figures, to which reference will explicitly be made with respect to all of the details that are essential to the invention and are not illustrated further in the description. All elements not essential to direct understanding of the invention have been omitted. Identical elements are given the same reference numerals in the individual figures.

BRIEF DESCRIPTION OF THE DRAWINGS

Embodiments of the present invention will be detailed subsequently referring to the appended drawings, in which.

DETAILED DESCRIPTION OF THE INVENTION

The invention will be explained in more detail below with reference to several embodiments.

Figure 1:
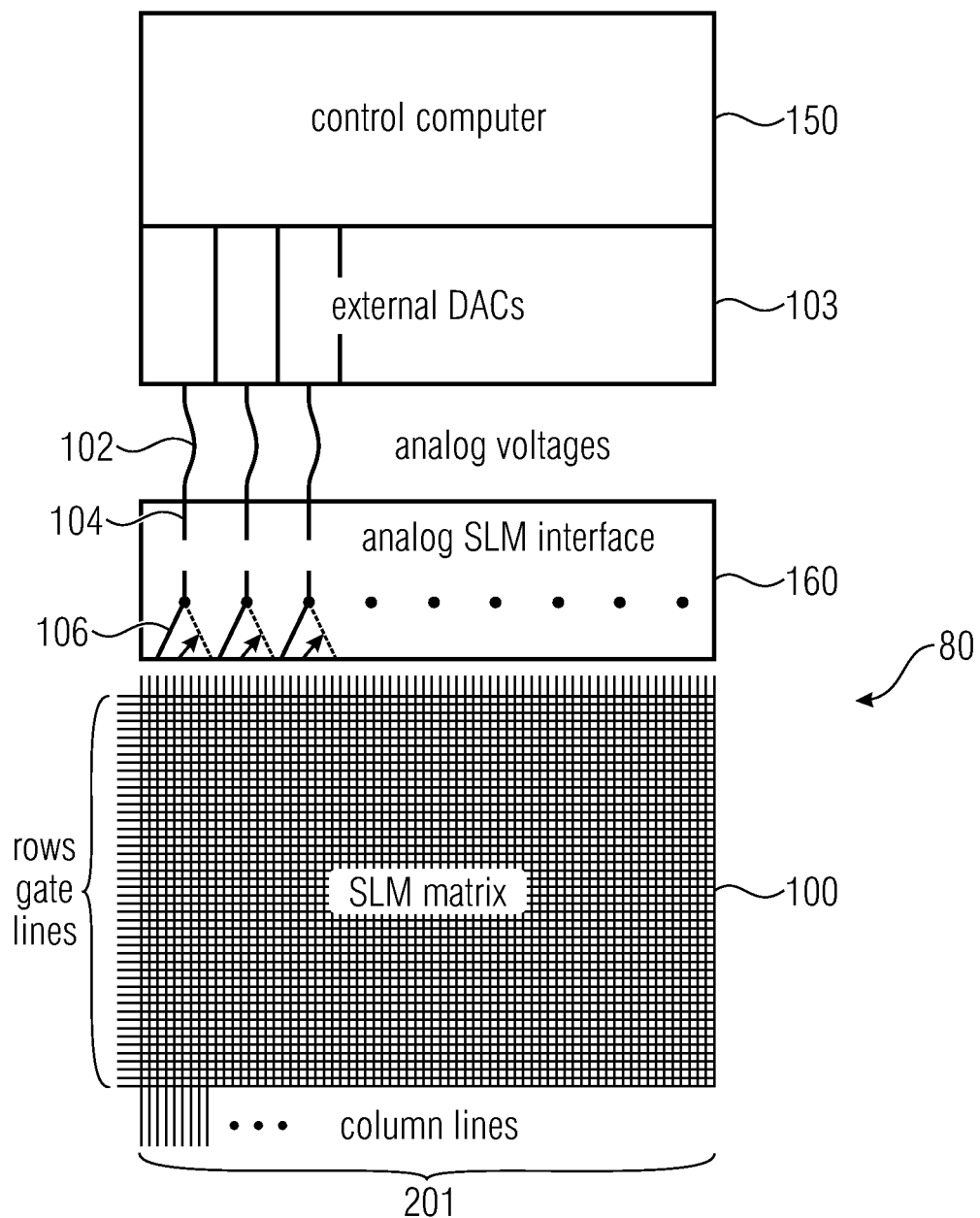
FIG. 1 schematically shows a spatial light modulator comprising analog data inputs as well as an external control circuit in accordance with conventional technology, FIG. 2 schematically shows an inventive spatial light modulator comprising digital data inputs, FIG. 3 schematically shows a DRAM structure of an analog spatial light modulator, FIG. 4 schematically shows a circuit diagram of a conventional digital-to-analog converter comprising output operational amplifier, FIG. 5 schematically shows a circuit diagram of a D/A converter of an inventive control circuit, FIG. 6 schematically shows a diagram of the useful reference voltage as a function of a column capacitance, FIG. 7 schematically shows a column structure of a spatial light modulator in two embodiments, FIG. 8 schematically shows a circuit diagram of a D/A converter comprising reduced capacitances, FIG. 9 schematically shows a circuit diagram of a D/A converter comprising initialization of the column capacitance by one of several reference voltages, FIG. 10 schematically shows a circuit diagram of a D/A converter comprising several reference voltages, and FIG. 11 schematically shows a circuit diagram of a D/A converter comprising three reference voltages and initialization of the column capacitance.

FIG. 1 schematically shows an externally controlled spatial light modulator 80, which is indicated as a two-dimensional matrix/SLM matrix 100 in a common design. The external control circuit comprising a plurality of external digital-to-analog converters/DACs 103, serves to change the elevations and/or tilts of a plurality of micromirrors. The micromirrors, also referred to as pixels, change their respective elevations and/or tilts via appropriately controlled micromechanical actuators. The external digital-to-analog converters/DACs 103 are controlled by digital signals via a control computer 150 and provide corresponding analog signals (voltages) at their outputs. The analog voltages are then applied to column lines 201 of the SLM matrix 100 via an analog SLM interface 160 through its analog multiplexers 106.

In addition to the actual desired load—the micromechanical actuator—other parasitic loads are exemplified as supply lines 102, bond pads 104. The bond pads 104 are surfaces of a semiconductor element that are to be contacted which serve, for example, to connect the supply lines 102. Furthermore, ESD protection circuits (not shown) may also act as a further parasitic load, for example. The components listed, for example, are mainly responsible for the fact that due to their mere sizes and capacitances, a compact overall design of the spatial light modulator SLM comprising a corresponding control circuit is made more difficult.

Figure 2:
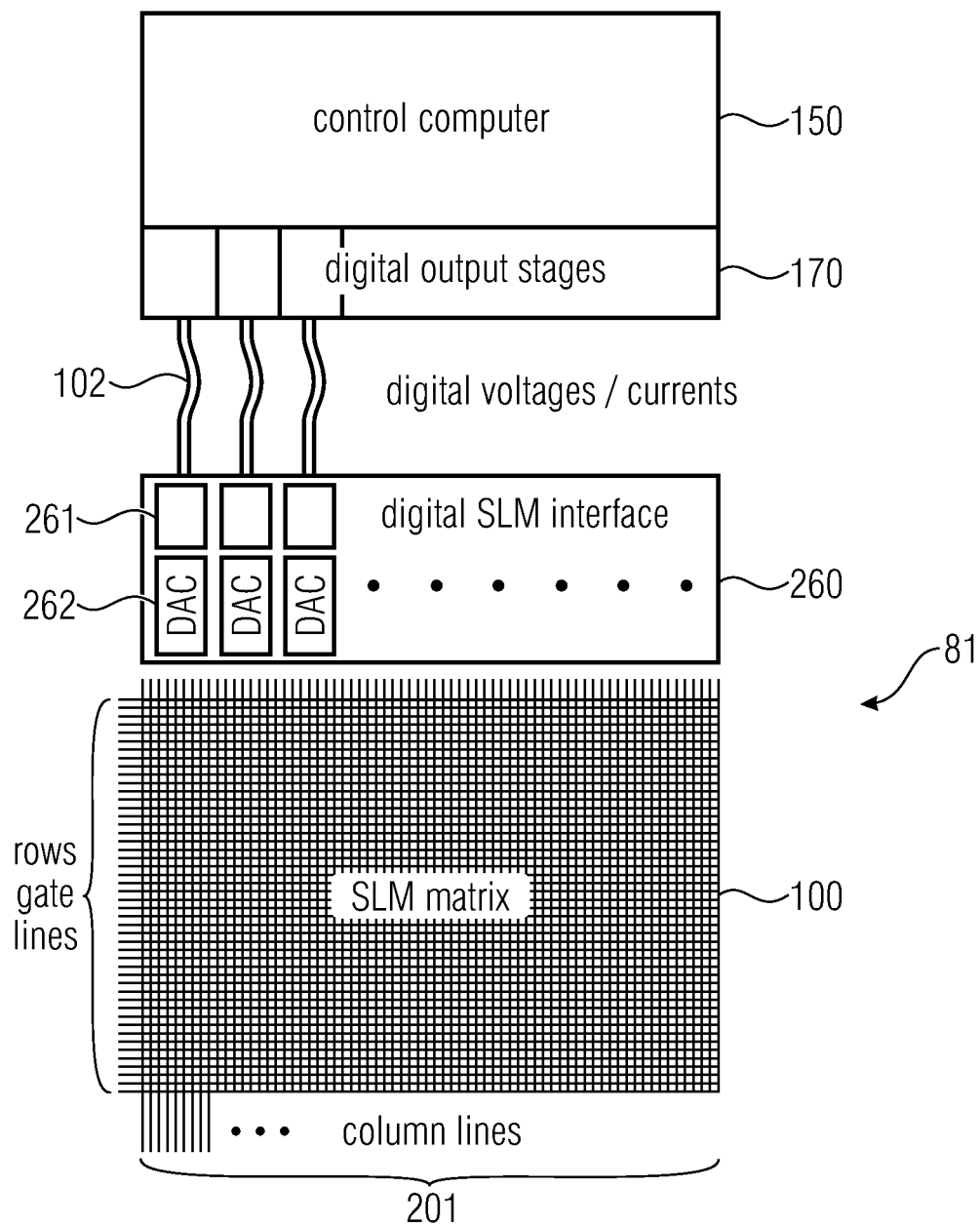

FIG. 2 shows an inventive embodiment of a spatial light modulator 81 comprising a digital SLM interface 260. The digital SLM interface 260 of this embodiment in turn has a plurality of digital input stages 261 provided for receiving digital signals (voltages/currents) that may be fed directly from digital output stages 170 of the control computer 150 via the supply lines 102. In addition, a plurality of digital-to-analog converters 262 are arranged in the digital SLM interface 260. The digital-to-analog converters 262 enable the SLM matrix 100 to be controlled via its column lines 201 with analog voltage values.

Figure 3:
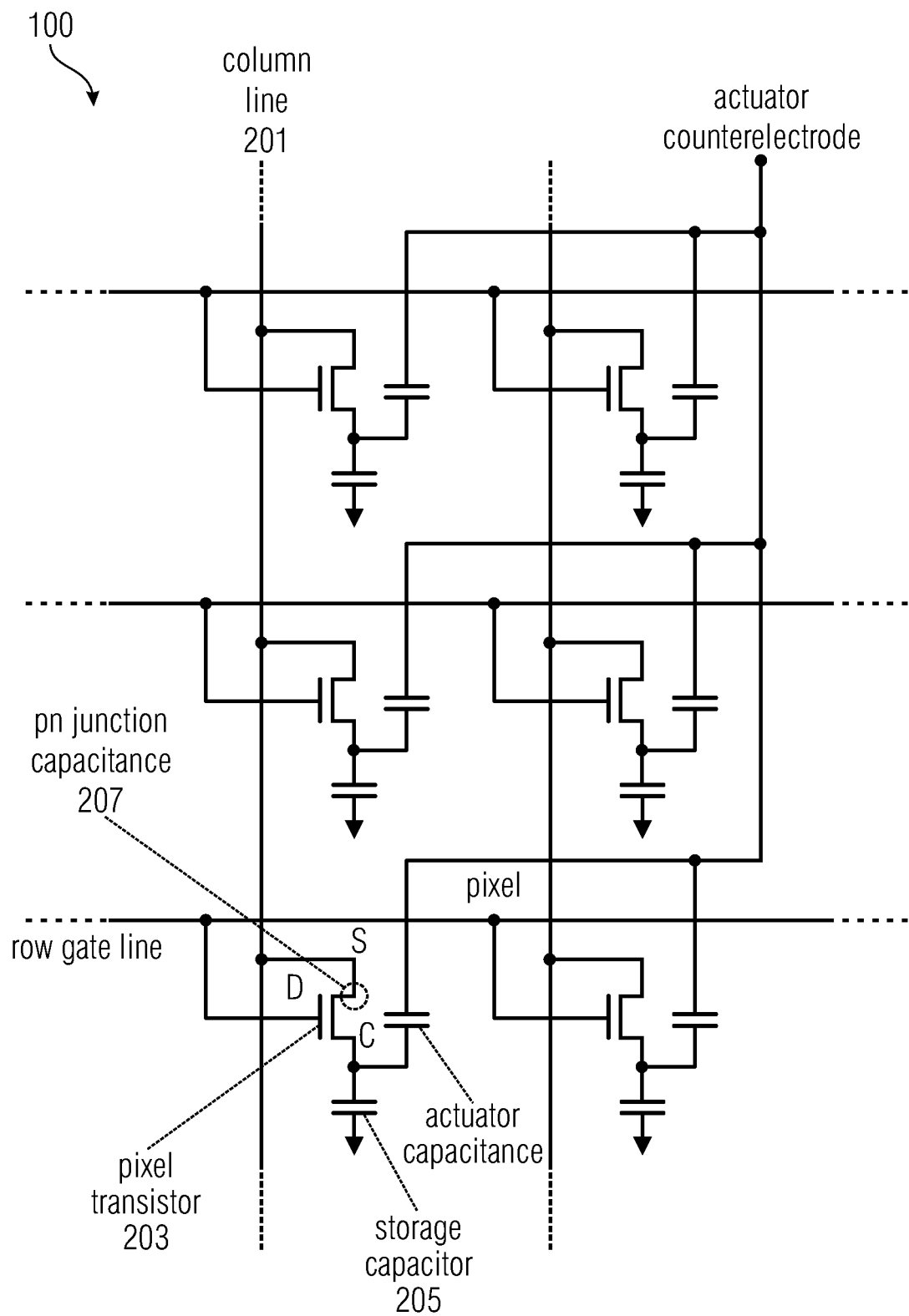

FIG. 3 schematically illustrates an exemplary sub-region of an SLM matrix 100 having six identical memory cells, each corresponding to one of six pixels of the SLM matrix 100. One of these memory cells of the depicted sub-region, which corresponds to a pixel, is shown shaded in gray, on the basis of a corresponding DRAM structure. Under each micromechanical actuator/pixel, such an electronic random access memory device is arranged. An analog DRAM cell comprising a transistor, e.g. a pixel transistor 203, and a storage capacitance/storage capacitor 205, stores an address voltage value until a next refresh. The DRAM structure shown shaded in gray is further characterized by an actuator capacitance and a pn junction capacitance 207. The pn junction capacitance 207 occurs at the material transition in semiconductor crystals between regions of opposite doping of the pixel transistor 203.

For example, an analog voltage is written into the SLM matrix 100 row by row. For this purpose, all gates of the pixel transistors 203 of a row are opened while the column lines 201 and, thus, the sources of the pixel transistors 203 each have the desired voltages at the same time. When the gates of the pixel transistors 203 are closed, the applied voltages are stored in the capacitances of the pixel cells of this row. All the pixel transistor sources of a column are connected to the column line 201. The total capacitance of such a column line 201 is mainly determined by the pn capacitance 207 of a so-called source region of the pixel transistors 203 and therefore increases as the size of the array increases.

Figure 5:
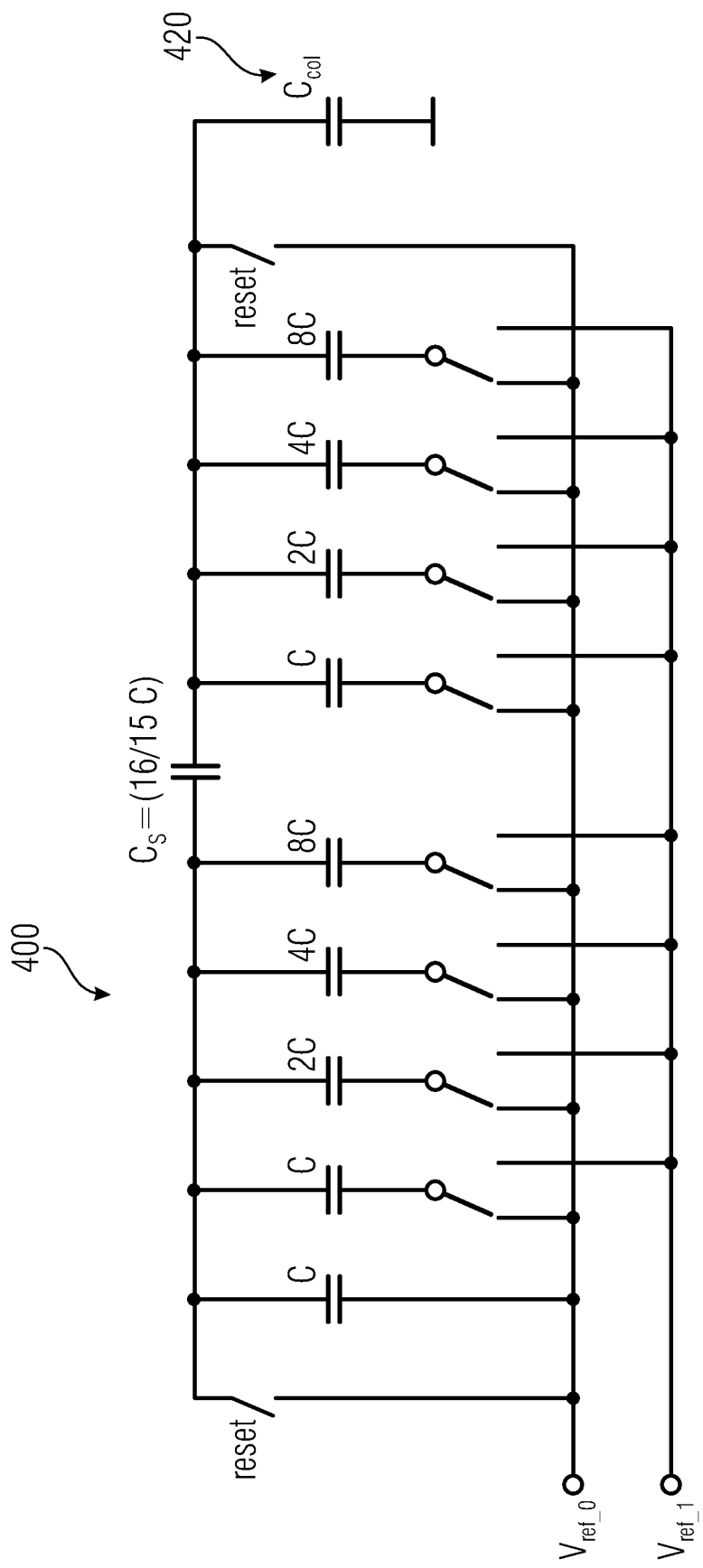

FIG. 5 shows a circuit diagram of a digital-to-analog converter 400 of an inventive control circuit for controlling micromechanical actuators. The circuit diagram corresponds to a region of an SLM chip between a digital data interface and the micromechanical actuators. A digital-to-analog converter is also referred to as a DAC.

FIG. 5 shows a special form of digital-to-analog converter, namely a so-called charge scaling DAC, the capacitance of the SLM column line here being directly incorporated as a useful capacitance into the capacitive voltage dividers with the existing charge scaling capacitances, and no operational amplifiers (OPVs) being used, as is the case with conventional digital-to-analog converters.

Figure 4:
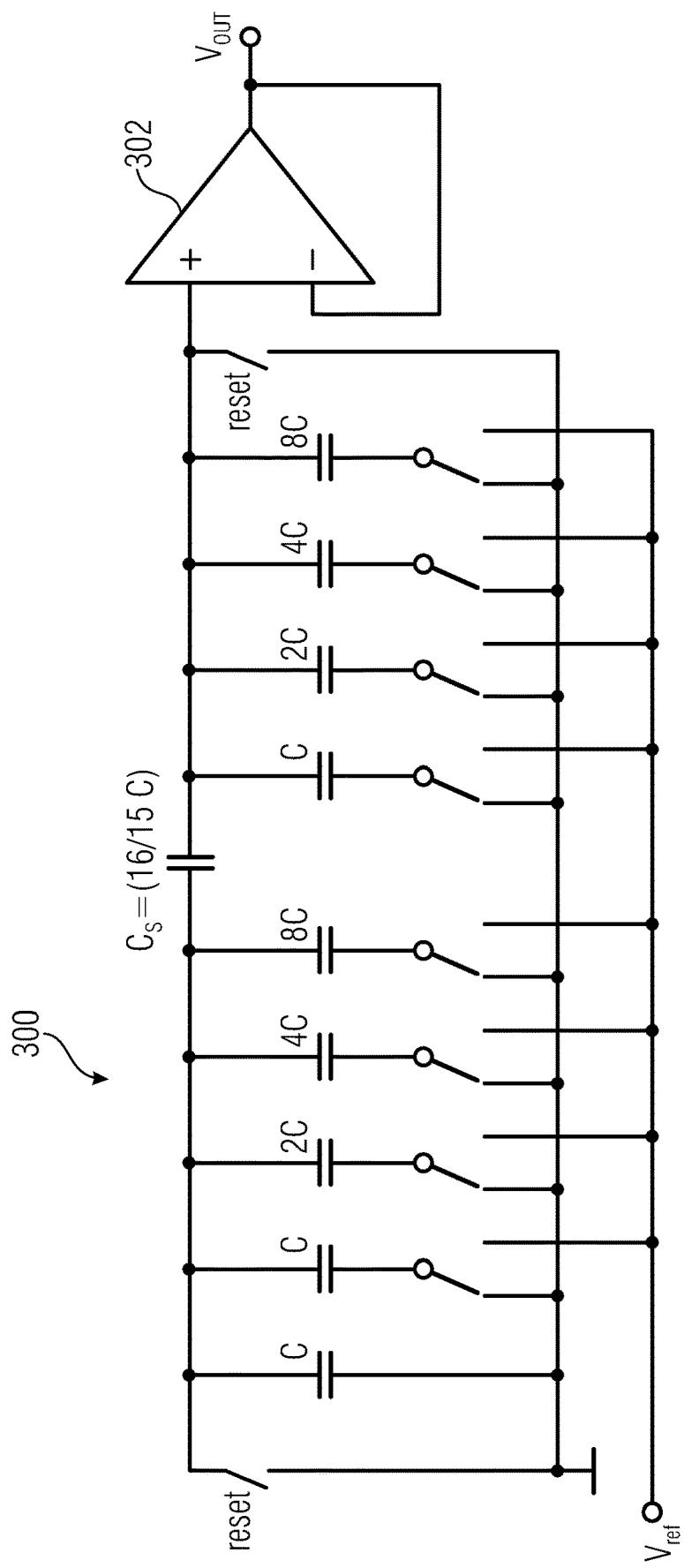

FIG. 4 shows a circuit diagram of such a conventional digital-to-analog converter (DAC) 300 comprising an operational amplifier (OPV) 302 having a reference voltage $V_{ref}$. Such a DAC 300 might alternatively be implemented with resistor strings or current mirrors, in which case it would exhibit considerably higher power dissipation. In contrast, the digital-to-analog converter 300 shown here, like the DAC 400 of FIG. 5, is based on a so-called charge scaling concept, which has capacitances with which comparatively low-loss operation is possible.

The digital-to-analog converter of FIG. 4 has a so-called unity-gain OPV 302 as an impedance converter at the output so as to provide a load-independent voltage. This OPV 302 additionally involves higher power consumption, which may increase as a function of speed during operation. In addition, other factors such as linearity and transient response should be considered in this case, where a disadvantageous behavior of the conventional digital-to-analog converters becomes apparent. Furthermore, OPVs may also be very susceptible to mismatch in the differential input stage. This may be of particular importance since hundreds of OPVs are integrated in parallel here, which may greatly reduce the yield in the assembly process/manufacturing process, for example.

In accordance with the embodiment, to enable a compact design of the overall system comprising a digital interface, the digital-to-analog converters 400 are integrated on the SLM chip together with the digital-to-analog converter of FIG. 5. In this context, power consumption may be kept as low as possible so that the voltages that may be used for the micromirrors can be generated at the highest possible frame rates while still keeping heat generation at a moderate level. The size of the column capacitance $C_{col}$ 420, the voltage and the refresh rate result in minimum power consumption. Due to the integrated DACs, as little additional energy as possible should be consumed.

The embodiment of the digital-to-analog converter 400 of FIG. 5 corresponds to an SLM chip comprising an integrated digital data interface and charge scaling DACs. Here, the capacitance of the SLM column line is directly incorporated into the capacitive voltage dividers, and no OPVs are required. This may save, without sacrificing accuracy, potential power dissipation of operational amplifiers since the loads to be served by the digital-to-analog converters are small and known with a high degree of accuracy, as well as all being virtually the same size.

In order that a desired voltage on the column capacitance $C_{col}$ 420 may be achieved, a higher reference voltage dependent on the ratio of DAC unit capacitance C to $C_{col}$ may be applied to a so-called cascode charge scaling DAC comprising charge scaling capacitances, but not requiring an OPV, as according to FIG. 5, as can be seen from the following equation.

$$V_{ref} = V_{col\_max}\frac{C_{DAC} + C_{col}}{C_{DAC}} = V_{col\_max}\frac{16C + C_{col}}{16C} \rightarrow \frac{V_{ref}}{V_{col\_max}} = 1 + \frac{C_{col}}{C}$$

This may initially worsen the power balance, but if the capacitances are large enough, less power is converted than is the case with additional OPV, and the reference voltage is allowed to be less. If the reference voltage is increased in terms of proportion, the column voltage $V_{col}$ that is achieved will depend on the switched capacitance of the DAC in a directly linear manner, as shown in the following equation.

$$V_{col} = V_{ref}\frac{C_{DAC\_on\_bits}}{C_{col} + C_{DAC\_all\_bits}}$$

Figure 6:
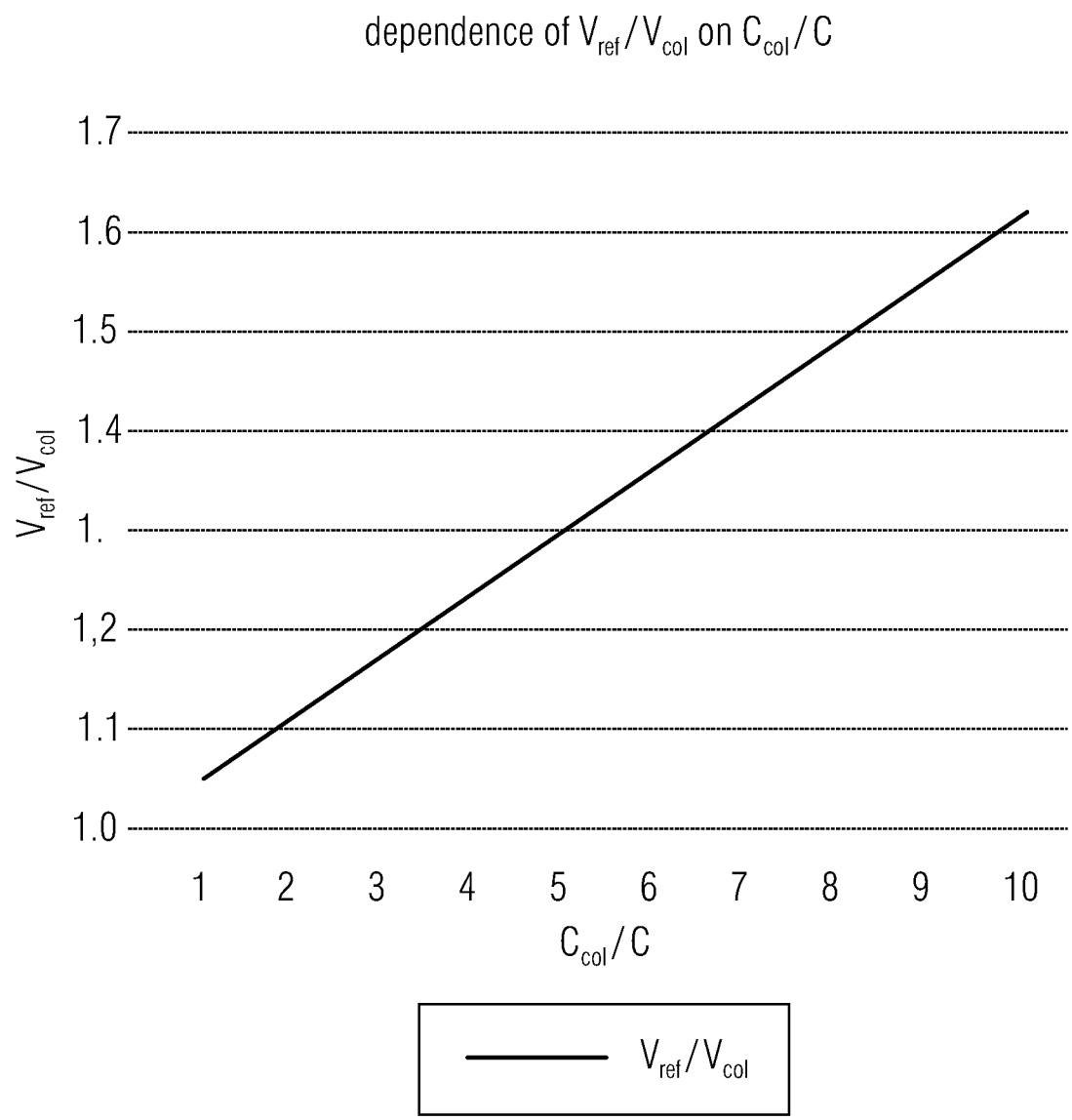

In this respect, FIG. 6 shows the dependence of the voltage that may be used on the ratio of the (DAC) unit capacitance to the column capacitance in a diagram.

Figure 7:
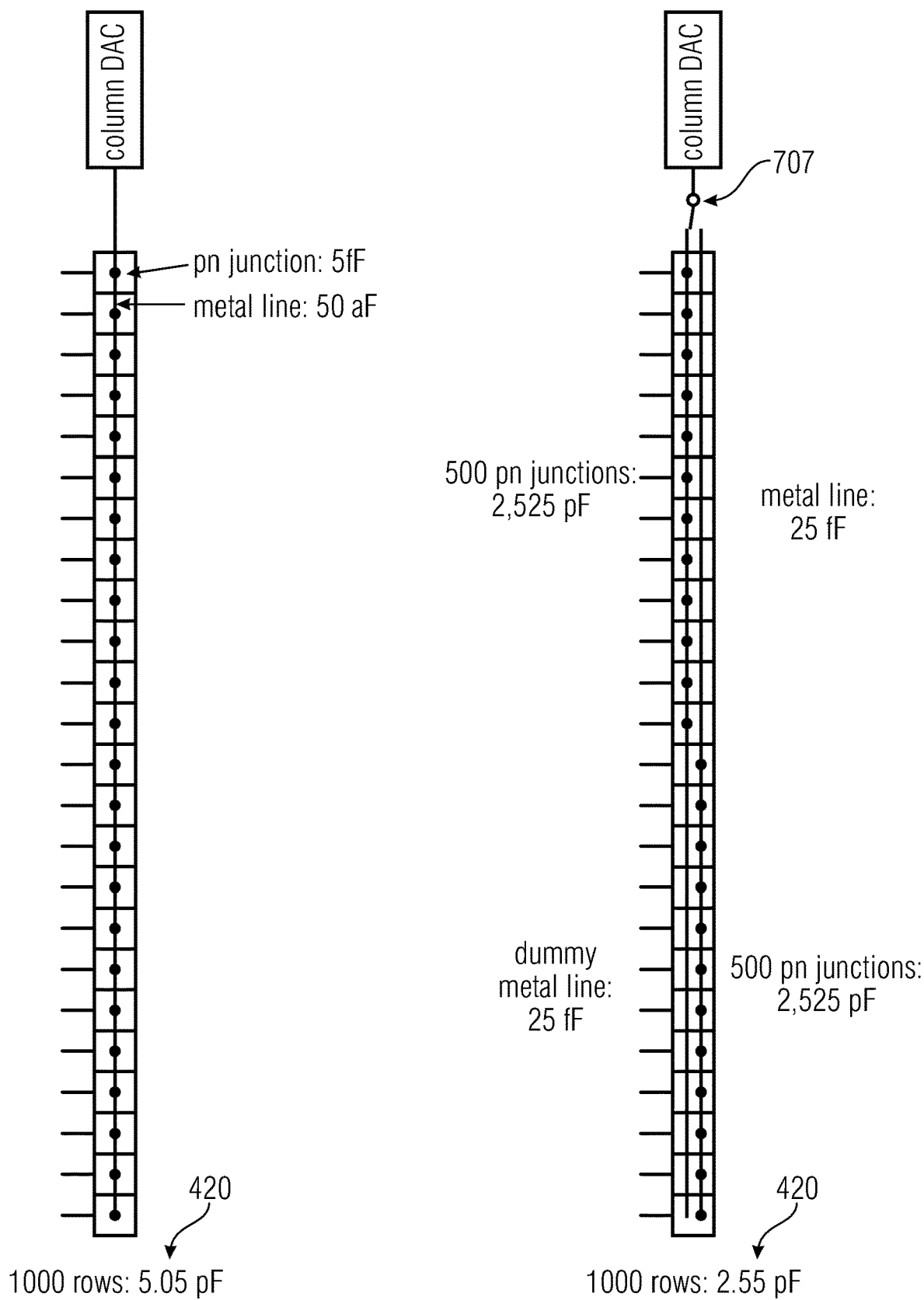

FIG. 7 shows an embodiment in which a possibility for reducing the size of the charge scaling capacitances is illustrated. By dividing the columns, the capacitance of the column line is halved while the speed of the digital-to-analog converter remains the same. This measure may also halve the capacitance of the digital-to-analog converter's capacitors without involving the need to increase the reference voltage.

This may advantageously reduce a layout area that may be used on the SLM chip. However, this arrangement involves an analog multiplexer 707 as an additional electronic component. Another advantage of this arrangement, in addition to saving layout area on the SLM chip, also allows the power converted in the SLM chip to be reduced by about half.

Said division may involve dividing the columns in more than two sections. As a limitation, care may be taken to ensure that the additional column lines are routed through the pixel cell. For very high partial factors, for example, increased constructional effort would be useful, caused by the additional column lines and the multiplexer 707 that may additionally be used.

Figure 8:
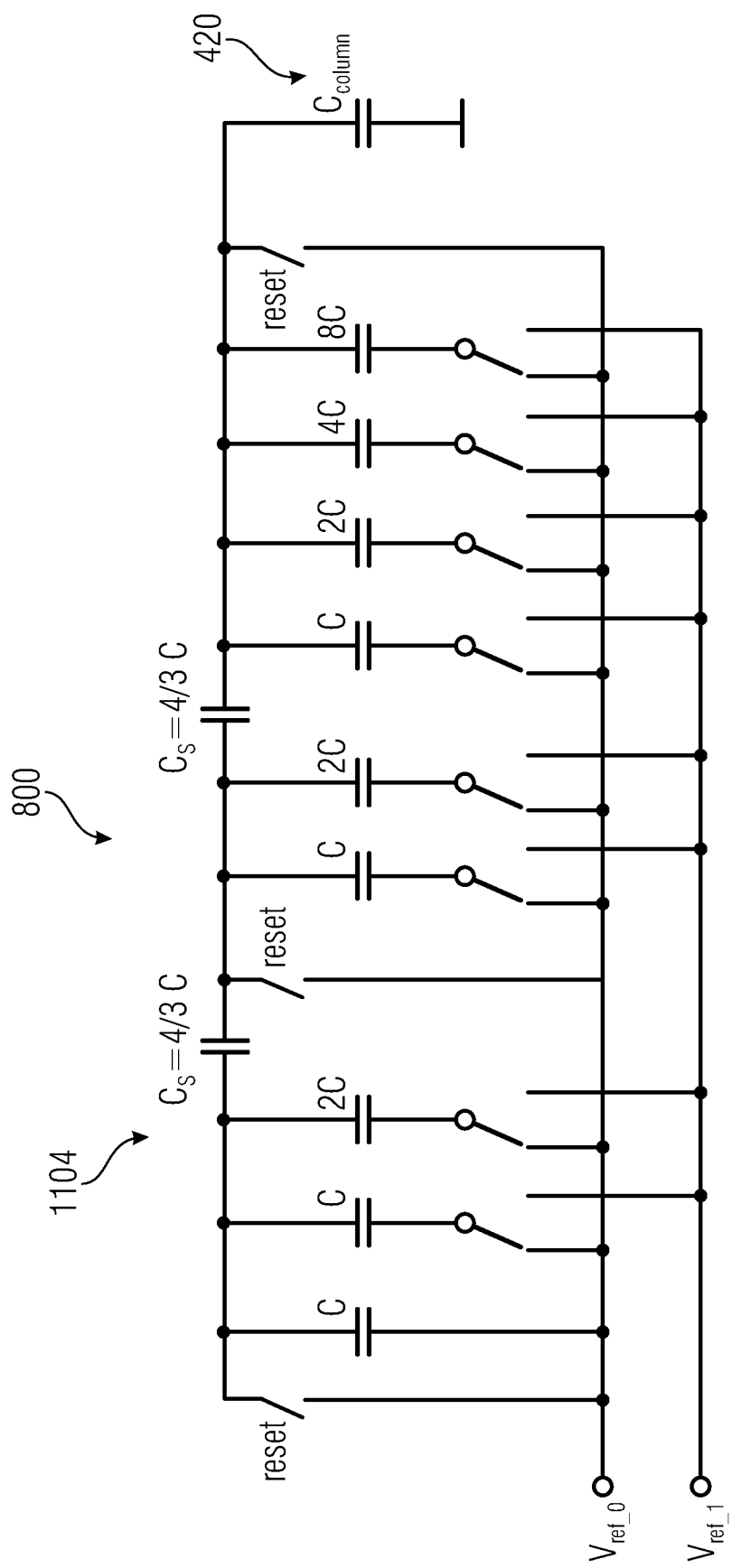

FIG. 8 shows another embodiment of a digital-to-analog converter 800, with which a further reduction of the useful total capacitance is made possible. This allows further reduction of power dissipation and layout area on the SLM chip. Here, the low-order bits of the cascode circuit are replaced by a C/2C chain or by a two-bit cascode circuit. With equal precision, a capacitance of only approx. 2.17 C per bit may be used here, whereas more than 4 C per bit may be used in the four-bit cascode circuit shown in FIG. 5.

Here, 4/3 C is selected as the coupling capacitor $C_s$ 1104, since this results in a uniform gradation of the analog values as the data value increases. Deviating values of the coupling capacitor $C_s$ 1104 here might lead to uneven steps in the resulting voltages. Suitable calibration may then provide for increased precision.

In general, the optimum value of the coupling capacitor is $n/(n-1)$ C, where n denotes the number of different possible values of the lower-order stage of the circuit that is to be coupled; for example, n=4 for the two-bit stages in FIG. 5.

In order to keep the previously described increase in the reference voltage within appropriate limits, the high-order bits of the cascode circuit should not be replaced by corresponding circuits of the low-order bits in this embodiment. The larger capacitances of this area having the high-order bits in the cascode circuit allow the reference voltage to be limited.

Figure 9:
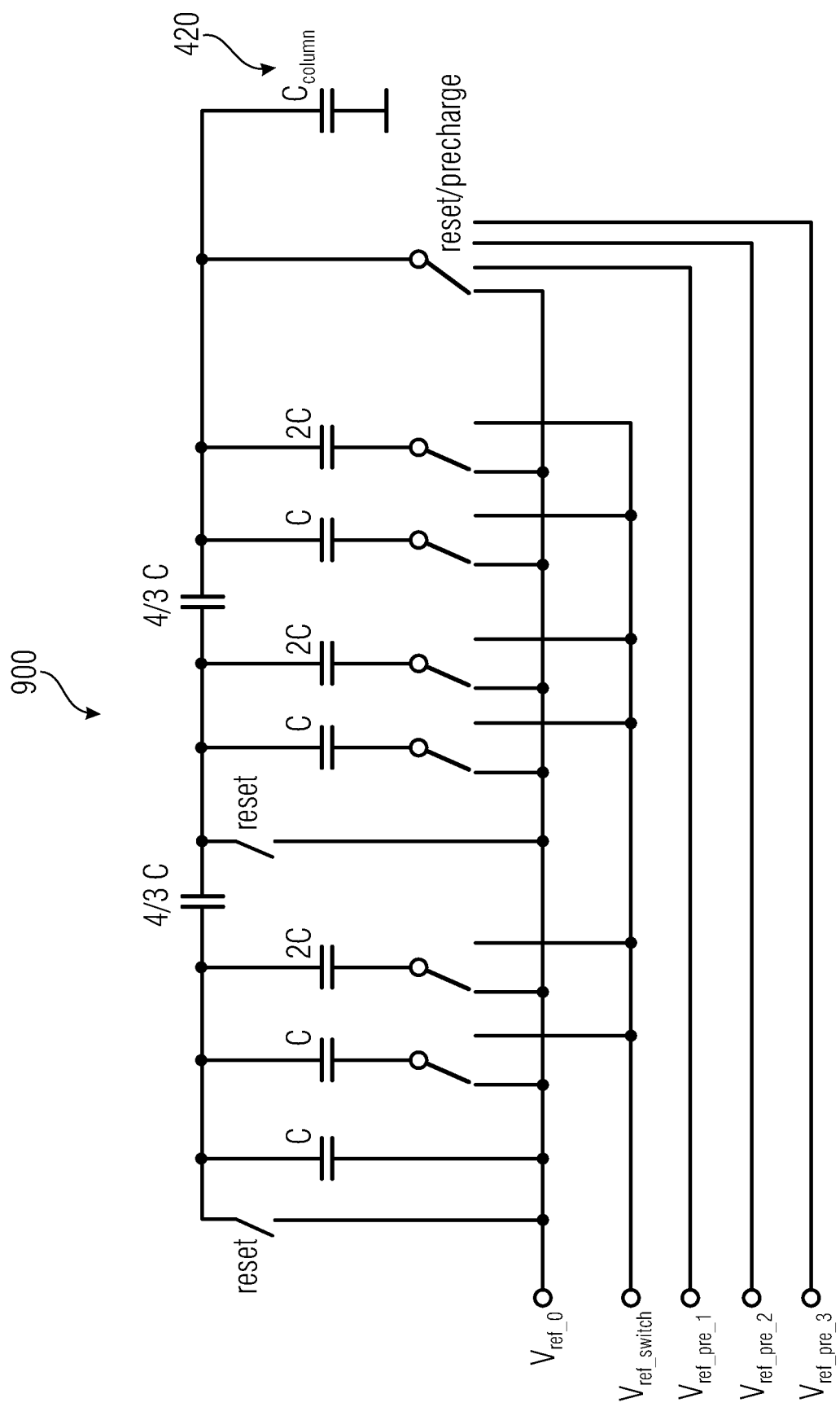

FIG. 9 shows a further embodiment of a digital-to-analog converter 900, in which a further improvement in performance characteristics may be achieved. This effect may be achieved by precharging the column capacitance 420 to a partial voltage during the initialization phase of the DAC.

In this embodiment, four reference voltages are provided that may be switched in via reset and preset switches. One of these, usually the smallest, may again be the circuit ground. In a first step, the load capacitance is initially precharged to the next lower reference voltage of a target value in accordance with the two most significant data bits, while the capacitors of the load divider circuit are reset by a short-circuit to ground.

After opening the initialization switches (reset and preset), in a second step the capacitors of the load divider circuit are charged with one of the reference voltages or held at ground, in accordance with the remaining data bits. Since only a fraction of the output voltage range has to be served at the load capacitance in this second step, the highest of the reference voltages may be smaller, or the capacitance of the capacitors may be dimensioned to be lower.

In this embodiment, it should be noted that the plurality of reference voltages should be provided in a correspondingly stable and loadable manner. Provision of these fixed reference voltages is performed by the control circuit, wherein a certain power dissipation and a possibly increased expenditure in terms of circuitry should be taken in to account. This involves a sufficient number of bond pads on the SLM chip to be available with precision in every part of the SLM chip, and the number of Interface lines may be increased. However, for more complex SLM chips comprising millions of micromirrors, the advantages of this embodiment have priority.

As an alternative to the embodiment of FIG. 9, the load divider circuit may also be operated at one of the reference voltages for initializing the column line, which saves provision of a further reference voltage.

Alternatively, the load capacitance may be precharged to the next higher reference voltage while the remaining data bits have their reference voltage applied to them. In the second step, depending on the digital value to be converted, short-circuit to ground was then applied to the corresponding data bits. Taken by itself, this alternative is equivalent to the previous version, but if, in an SLM chip comprising a very large number of pixels, all data values typically occur on an equal basis, simultaneous utilization of both versions—for example, alternating column by column—may on average considerably reduce the dynamic load on the reference voltages, while it is possible to increase precision.

Figure 10:
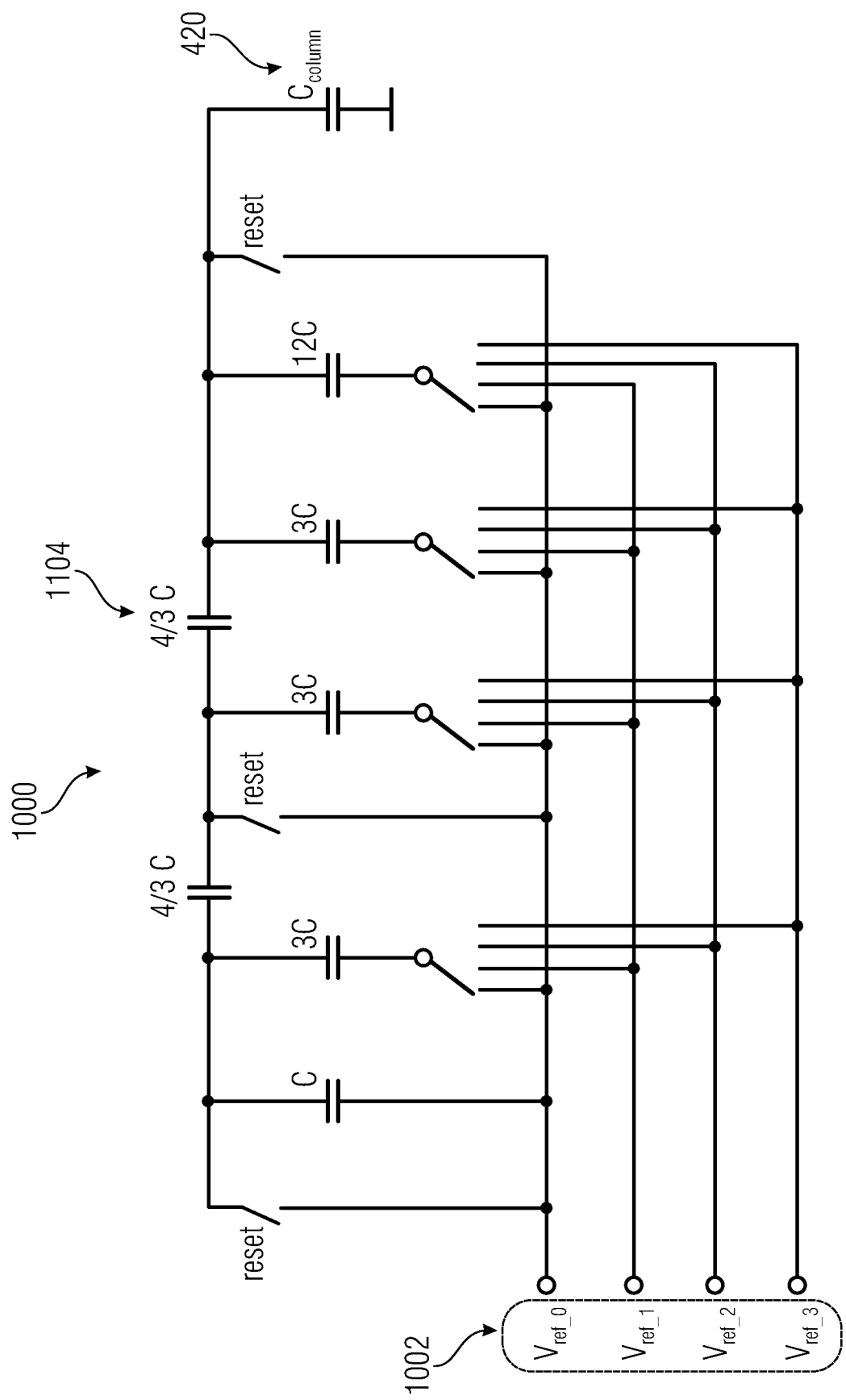

FIG. 10 refers to a variant of a digital-to-analog converter 1000 having, for example, four reference voltages 1002. In this embodiment, the reference voltages are used in all stages of the load divider circuit. This means that fewer stages are needed in the charge divider circuit since each of these stages now represents more than one data bit. They are not fully charged and discharged in each clock cycle, which may reduce power dissipation while precision may be increased.

Alternatively, a different number n of reference voltages may be used. The optimal value of the coupling capacitor 1104 is again n/(n−1) C, although deviating values might lead to uneven steps in the resulting voltages. Suitable calibration may provide for increased precision in this case.

Figure 11:
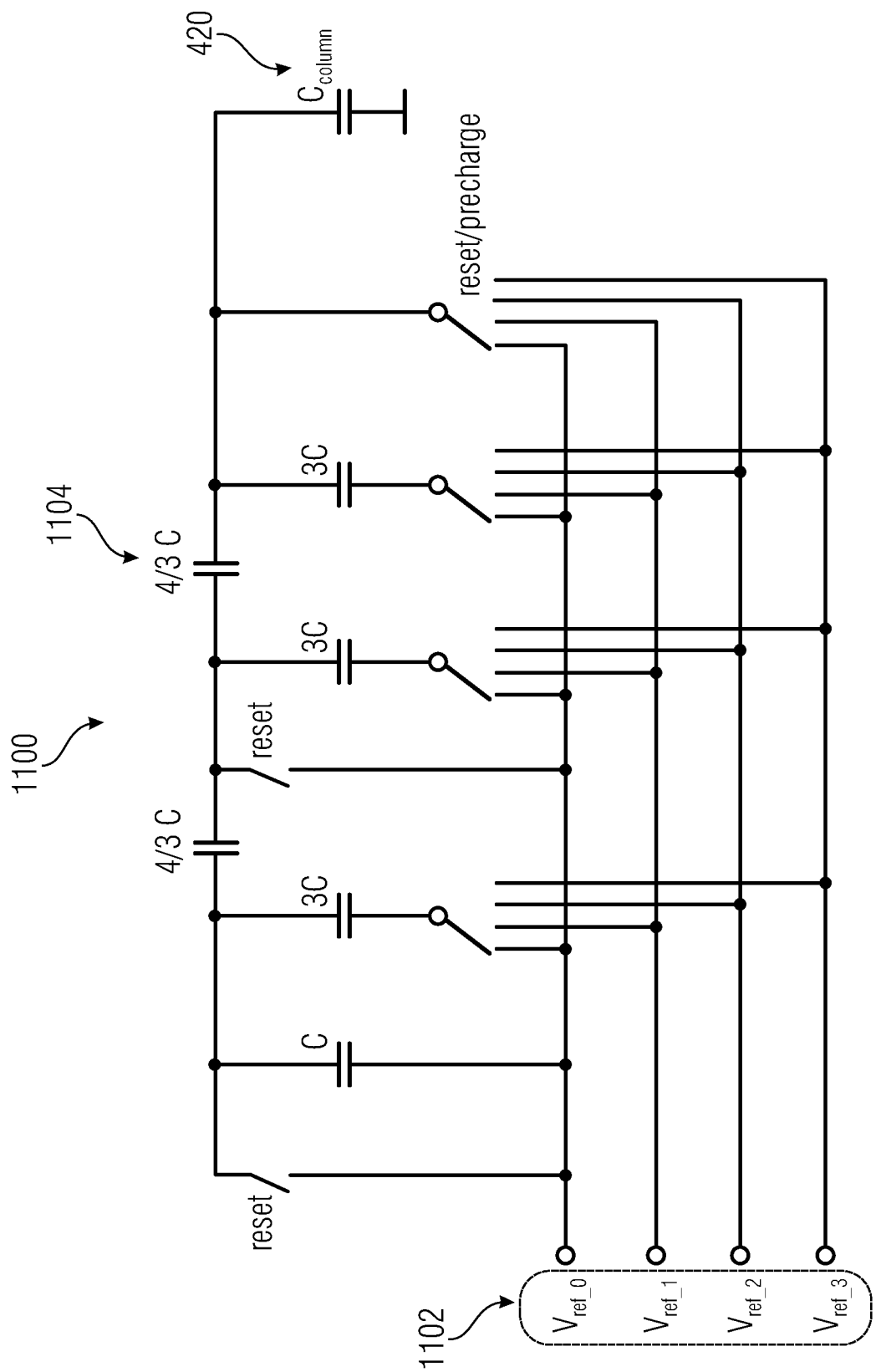

FIG. 11 shows an embodiment of a digital-to-analog converter 1100, where, again, several reference voltages 1102 are available. These are used here as in FIG. 10 for controlling the DAC steps, and also simultaneously as in FIG. 9 for initializing the load capacitance. The advantages of both above variants may thus be combined.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:
1. An arrangement for controlling micromechanical actuators, comprising the following features:
a digital-to-analog converter; and
a plurality of micromechanical actuators; wherein
the micromechanical actuators are coupled to a connecting structure; wherein
the digital-to-analog converter is configured to provide a voltage to be applied to the connecting structure by an adjustable capacitive voltage division that is dependent on a digital input value of the digital-to-analog converter, wherein
the digital-to-analog converter is configured to directly incorporate a capacitance of the connecting structure into the capacitive voltage division; wherein
the connecting structure comprises a connecting line and a plurality of switching transistors connected between the connecting line and storage capacitors associated with the respective micromechanical actuators; and wherein
the connecting line is passively coupled to a plurality of capacitors that serve to provide adjustable voltage division; wherein
the digital-to-analog converter comprises a first group of the capacitors whose first terminals are DC-coupled and whose second terminals are alternatively connected to one of at least two different reference potentials, as a function of a digital value; wherein
the digital-to-analog converter comprises a second group of the capacitors whose first terminals are DC-coupled and whose second terminals are alternatively connected to one of the at least two different reference potentials, as a function of a digital value; wherein
the first terminals of the first group of the capacitors are DC-coupled to the connecting structure; and wherein
the first terminals of the second group of the capacitors are coupled to the first terminals of the first group of the capacitors via a first coupling capacitor.

2. The arrangement as claimed in claim 1, wherein
the connecting line is DC-coupled or directly coupled to a plurality of switched capacitors of the digital-to-analog converter.

3. The arrangement as claimed in claim 1, wherein
the digital-to-analog converter is configured to incorporate the capacitance of the connecting line and of semiconductor regions coupled into the capacitive voltage division toward a reference potential.

4. The arrangement as claimed in claim 1, wherein
the digital-to-analog converter and the micromechanical actuators are arranged on a semiconductor chip.

5. The arrangement as claimed in claim 1, wherein
the micromechanical actuators are arranged inside a spatial light modulator.

6. The arrangement as claimed in claim 1, wherein
the micromechanical actuators are arranged in columns, wherein a plurality of actuators in one column are coupled to a common connecting structure.

7. The arrangement as claimed in claim 1, wherein
a first portion of the actuators in an actuator column are coupled to a first column line, and wherein
a second portion of the actuators in the actuator column are coupled to a second column line, and wherein
the arrangement is configured to alternately couple the first column line and the second column line to switched capacitors of the digital-to-analog converter or to simultaneously couple them to two different digital-to-analog converters.

8. The arrangement as claimed in claim 1, wherein the digital-to-analog converter comprises a first reset switch adapted to couple the first terminals of the capacitors of the first group of capacitors to an associated reference potential; wherein
the digital-to-analog converter comprises a second reset switch adapted to couple the first terminals of the capacitors of the second group of capacitors to an associated reference potential.

9. The arrangement as claimed in claim 1, wherein
the digital-to-analog converter comprises a first group of capacitors whose first terminals are DC-coupled and whose second terminals are connected to at least three different reference potentials, as a function of a digital value, the selection of the reference potentials depending on at least two bits of a digital value, wherein
the digital-to-analog converter comprises a second group of capacitors whose first terminals are DC-coupled and whose second terminals are connected to at least three different reference potentials, as a function of a digital value; wherein
the first terminals of the first group of capacitors are DC-coupled to the connecting structure; wherein
the first terminals of the second group of capacitors are coupled to the first terminals of the first group of capacitors via a first coupling capacitor; wherein
the digital-to-analog converter comprises a first reset switch adapted to couple the first terminals of the capacitors of the first group of capacitors to an associated reference potential; wherein
the digital-to-analog converter comprises a second reset switch adapted to couple the first terminals of the capacitors of the second group of capacitors to an associated reference potential.

10. The arrangement as claimed in claim 8, wherein
the second group of capacitors comprises fewer different capacitances than does the first group of capacitors.

11. The arrangement as claimed in claim 8, wherein
the digital-to-analog converter comprises a third group of capacitors whose first terminals are DC-coupled and whose second terminals are connected to at least two different reference potentials, as a function of a digital value; wherein
the first terminals of the third group of capacitors are coupled to the first terminals of the second group of capacitors via a second coupling capacitor, wherein
the digital-to-analog converter comprises a third reset switch adapted to couple the first terminals of the capacitors of the third group of capacitors to an associated reference potential.

12. The arrangement as claimed in claim 8, wherein
the capacitance values of the first group of capacitors are stepped in a binary manner, and the capacitance values are multiples of a basic capacitance; wherein
the capacitance values of the second group of capacitors are again stepped in a binary manner and are multiples of the basic capacitance, wherein
a maximum capacitance value present in the second group of capacitors is, at the most, half the maximum capacitance value present in the first group of capacitors.

13. The arrangement as claimed in claim 8, wherein
the capacitance values of the first group of capacitors are stepped in a binary manner and are multiples of the basic capacitance, wherein
the capacitance values of the second group of capacitors are again binary stepped and comprise a multiple of the basic capacitance, wherein
a maximum capacitance value in the second group of capacitors is, at the most, a quarter of the maximum capacitance value present in the first group of capacitors.

14. The arrangement as claimed in claim 3, wherein
a first reset switch may couples the connecting structure to a reference potential.

15. The arrangement as claimed in claim 7, wherein
precharging of the capacitance of the connecting structure and/or of the capacitors of a first group of capacitors occurs during an initialization phase as a function of a digital value,
while other switched capacitors are precharged to data-independent voltages; wherein
subsequently, data-dependent connecting of the second terminals of the capacitors of the first group of capacitors and of a second group of capacitors to one of two or more different reference voltages takes place.

16. An arrangement for controlling micromechanical actuators, comprising the following features:
a digital-to-analog converter; and
a plurality of micromechanical actuators; wherein
the micromechanical actuators are coupled to a connecting structure; wherein
the digital-to-analog converter is configured to provide a voltage to be applied to the connecting structure by an adjustable capacitive voltage division that is dependent on a digital input value of the digital-to-analog converter, wherein
the digital-to-analog converter is configured to directly incorporate a capacitance of the connecting structure into the capacitive voltage division; wherein
the connecting structure comprises a connecting line and a plurality of switching transistors connected between the connecting line and storage capacitors associated with the respective micromechanical actuators; wherein
a first portion of the actuators in an actuator column are coupled to a first column line, and wherein
a second portion of the actuators in the actuator column are coupled to a second column line, wherein
the arrangement is configured to alternately couple the first column line and the second column line to switched capacitors of the digital-to-analog converter or to simultaneously couple them to two different digital-to-analog converters; and wherein
the arrangement comprises a plurality of connecting structures, wherein
in an initialization phase associated with providing an analog value on the first connecting structure, at least a first one of the connecting structures is precharged to a potential that is below a target potential for the first connecting structure;
in an initialization phase associated with providing an analog value on the second connecting structure, at least a second one of the connecting structures is precharged to a potential that is above a target potential for the second connecting structure; wherein
after completion of the initialization phase associated with providing an analog value on the first connecting structure, the second terminals of the capacitors are connected to corresponding reference potential lines in a data-dependent manner so as to raise the potential of the first connecting structure to a target potential for the first connecting structure; wherein
after completion of the initialization phase associated with providing an analog value on the second connecting structure, the second terminals of the capacitors are connected to corresponding reference potential lines in a data-dependent manner to decrease the potential of the first connecting structure to a target potential for the second connecting structure.

17. The arrangement as claimed in claim 3, wherein a multiplexer is provided in the arrangement, said multiplexer selectively coupling the switched capacitances of the digital-to-analog converter to different connecting structures and/or column lines.

18. The arrangement as claimed in claim 3, wherein the arrangement is configured to use the connecting structure as a temporary storage for a charge, and to at least partially transfer the charge stored on the connecting structure to an actuator or to a storage capacitance associated with the actuator following disconnection of the switched capacitances of the digital-to-analog converter from the connecting structure.

19. A method of controlling micromechanical actuators in an arrangement comprising a digital-to-analog converter and a plurality of micromechanical actuators coupled to a connecting structure, wherein a voltage present at the connecting structure is determined by an adjustable capacitive voltage division that is dependent on a digital input value, wherein the digital-to-analog converter is configured to provide a voltage to be applied to the connecting structure by an adjustable capacitive voltage division that is dependent on a digital input value of the digital-to-analog converter, wherein the digital-to-analog converter is configured to directly incorporate a capacitance of the connecting structure into the capacitive voltage division; wherein the connecting structure comprises a connecting line and a plurality of switching transistors connected between the connecting line and storage capacitors associated with the respective micromechanical actuators; wherein the connecting line is passively coupled to a plurality of capacitors that serve to provide adjustable voltage division; wherein the digital-to-analog converter comprises a first group of the capacitors whose first terminals are DC-coupled and whose second terminals are alternatively connected to one of at least two different reference potentials, as a function of a digital value; wherein the digital-to-analog converter comprises a second group of the capacitors whose first terminals are DC-coupled and whose second terminals are alternatively connected to one of the at least two different reference potentials, as a function of a digital value; wherein the first terminals of the first group of the capacitors are DC-coupled to the connecting structure; and wherein the first terminals of the second group of the capacitors are coupled to the first terminals of the first group of the capacitors via a first coupling capacitor.

20. A non-transitory digital storage medium having a computer program stored thereon to perform the method of controlling micromechanical actuators in an arrangement comprising a digital-to-analog converter and a plurality of micromechanical actuators coupled to a connecting structure, wherein:

a voltage present at the connecting structure is determined by an adjustable capacitive voltage division that is dependent on a digital input value, wherein the digital-to-analog converter is configured to provide a voltage to be applied to the connecting structure by an adjustable capacitive voltage division that is dependent on a digital input value of the digital-to-analog converter, wherein the digital-to-analog converter is configured to directly incorporate a capacitance of the connecting structure into the capacitive voltage division; wherein the connecting structure comprises a connecting line and a plurality of switching transistors connected between the connecting line and storage capacitors associated with the respective micromechanical actuators; wherein the connecting line is passively coupled to a plurality of capacitors that serve to provide adjustable voltage division; wherein the digital-to-analog converter comprises a first group of the capacitors whose first terminals are DC-coupled and whose second terminals are alternatively connected to one of at least two different reference potentials, as a function of the digital input value; wherein the digital-to-analog converter comprises a second group of the capacitors whose first terminals are DC-coupled and whose second terminals are alternatively connected to one of the at least two different reference potentials, as a function of the digital input value; wherein the first terminals of the first group of the capacitors are DC-coupled to the connecting structure; and wherein the first terminals of the second group of the capacitors are coupled to the first terminals of the first group of the capacitors via a first coupling capacitor when said computer program is run by a computer.

* * * * *